United States Patent [19]

Mori

[11] Patent Number: 4,992,838

[45] Date of Patent: Feb. 12, 1991

[54] VERTICAL MOS TRANSISTOR WITH THRESHOLD VOLTAGE ADJUSTMENT

[75] Inventor: Kiyoshi Mori, Stafford, Tex.

[73] Assignee: Texas Instruments Incorporated, Dallas, Tex.

[21] Appl. No.: 161,706

[22] Filed: Feb. 29, 1988

[51] Int. Cl.⁵ .............................................. H01L 29/78
[52] U.S. Cl. ................................. 357/23.4; 357/23.12
[58] Field of Search ............................ 357/23.4, 23.12

[56] References Cited

U.S. PATENT DOCUMENTS

| | | | |
|---|---|---|---|
| 3,823,352 | 7/1974 | Pruniaux et al. | 357/23.4 |
| 3,867,204 | 2/1975 | Ruttedge | 357/23.12 |
| 4,052,229 | 10/1977 | Pashley | 357/23.12 |
| 4,163,988 | 8/1979 | Yeh et al. | 357/23.4 |

FOREIGN PATENT DOCUMENTS

| | | | |
|---|---|---|---|
| 58-184767 | 10/1983 | Japan | 357/23.4 |
| 62-52969 | 3/1987 | Japan | 357/23.4 |

*Primary Examiner*—William D. Larkins
*Attorney, Agent, or Firm*—Ronald O. Neerings; Thomas W. DeMond; Melvin Sharp

[57] ABSTRACT

A method and structure for adjustment of the threshold voltage of a vertical metal-oxide-semiconductor transistor. Chemical vapor deposition of doped silicon dioxide and annealing are used to form a voltage-threshold-adjustment region in at least the channel layer of the transistor adjacent to the trench wall.

8 Claims, 2 Drawing Sheets

VERTICAL MOS TRANSISTOR WITH THRESHOLD VOLTAGE ADJUSTMENT

BACKGROUND OF THE INVENTION

This invention relates to metal-oxide-semiconductor (MOS) transistors formed at the vertical sidewalls of trenches formed in layers of alternately doped semiconductor materials and, in particular, to construction using chemical vapor depositions and annealing to adjust the threshold voltage levels of those transistors.

Vertical MOS transistors, in general, have very narrow channel regions, those regions comprising thin layers between the source and drain layers. One method of decreasing the probability of undesired punch-through of the narrow channel regions at high bias voltages is to form the channel regions with impurity doping concentrations that are higher than the impurity doping concentrations in the source and drain areas. However, the high doping concentrations may result in transistors that, in many applications, have an undesirably high threshold voltage levels. Known prior-art vertical MOS transistor construction procedures and structures have not provided for adjustment of those high threshold voltage levels downward or, under other circumstances, for adjustment of the threshold voltage levels upward.

SUMMARY OF THE INVENTION

This invention comprises a method and structure for adjustment of the threshold voltage level of a vertical MOS transistor by altering the effective doping concentrations near the vertical surface of the source-channel-drain region. The altered doping concentrations are accomplished through use of chemical vapor depositions and annealing. In its simplest embodiment, the invention comprises a chemical vapor deposition of a doped silicon dioxide film over the vertical trench wall that forms the source-channel-drain surface of the transistor. The structure is then subjected to a short annealing cycle which causes diffusion of the doped impurities from the deposited film into the threshold-voltage-adjustment regions adjacent the inner source-channel-drain surface, thereby altering the threshold voltage. The doped film is then removed by a wet-etch process. Construction of the oxide layer and the gate of the transistor is then completed according to customary procedures.

In another embodiment of the invention, the effective doping concentration is altered only adjacent to the trench surface of the channel region of the transistor source-channel-drain trench structure by first forming a chemical vapor deposition film of non-doped silicon dioxide over the structure, including the trench walls. The film is then partially etched to leave a silicon dioxide layer at the bottom of the trench. The remaining silicon dioxide layer is sufficiently thick that its sides completely cover the vertical trench surface of the lower source-drain region. A second chemical vapor deposition film of doped silicon dioxide is then formed over the structure, including the exposed vertical trench surface. The second film is then partially etched to leave a remaining layer of sufficient thickness that its sides completely cover the vertical surface of the channel region but do not extend into the upper source-drain region. An annealing cycle then causes the impurity to out-diffuse from the doped second layer into the channel area to form a threshold-voltage-adjustment region. The two deposited layers are then removed by a wet-etch process. Construction of the oxide layer and gate of the transistor is then completed according to customary procedures.

BRIEF DESCRIPTION OF THE DRAWINGS

The novel features of the invention are set forth in the appended claims. The invention, its features, and its advantages are described below in conjunction with the following drawings:

DETAILED DESCRIPTION OF THE EMBODIMENTS

Figure 1A:
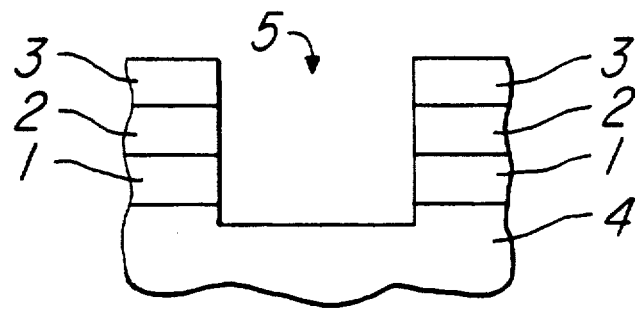
FIG. 1a–d are illustrated elevation views in section of a vertical MOS transistor at various stages of manufacture using a process of this invention to alter effective doping concentrations near the trench surfaces of the source, channel and drain of a vertical transistor.

Referring to FIG. 1(a), part of a vertical MOS transistor is shown in cross-section during construction and after formation of lower source-drain layer 1, channel layer 2, and upper source-drain layer 3 on substrate 4 and after formation of a trench 5 extending at least through upper layer 3 and channel layer 2. The Figures herein are not drawn to scale and are intended for explanation purposes only. Source-drain layers 1 may be used as either the source or the drain of the MOS transistor with source-drain layer 3 fulfilling the other function, depending on the application. The source-drain layers 1 and 3 and the channel layer 2 ar of opposite conductivity type, either P-type or N-type. Layers 1, 2 and 3 generally surround the trench, which may, for example, be a square, round or rectangular hole through those layers. The process described herein is to be performed prior to formation of an oxide layer and deposition of a polysilicon gate, for example, in accordance with procedures described in my copending application, Ser. No. 06/921,728, also assigned to Texas Instruments Incorporated.

Vertical MOS transistors generally have a very narrow channel region formed by a channel layer 2. Application of a supply source voltage potential between layers 1 and 3 causes a depletion layer to form at one of the junctions between the surfaces of either layer 1 or 3 and layer 2. In order to decrease the probability of the depletion layer extending through, or punching through, the thin layer 2 and damaging the transistor, layer 2 is often comprised of highly doped material. However, extensive doping of layer 2 causes the transistor to have a threshold voltage level that may be higher than desired for the particular device application. Decreasing the effective doping level near the vertical trench surface of channel layer 2 will decrease the voltage threshold level. Conversely, increasing the effective doping level of channel region 2 will increase the threshold voltage of the device, which may be desirable for certain applications.

Figure 1B:
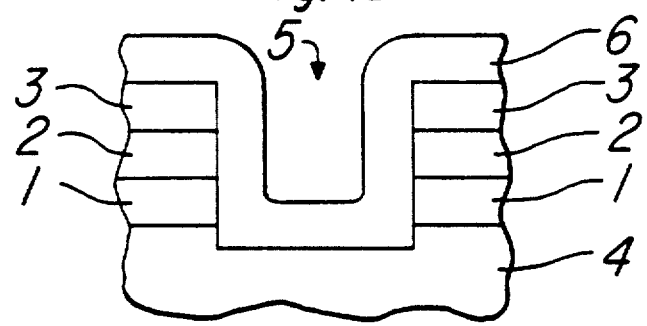

Referring to FIG. 1(b), a silicon dioxide film 6 with prescribed percentage of P-type or N-type impurities, such as boron or phosphorus, is deposited on the trench 5 surfaces and over the surface of the structure using any of the chemical vapor deposition processes that are well-known in the art. If the vertical transistor has a channel layer 2 of P-type material, silicon dioxide film 6 should contain phosphorus or other N-type impurity if it is desired to lower the threshold voltage of the device and should contain boron or other P-type impurity to raise the threshold voltage of the device. If the vertical transistor has a channel layer 2 of N-type material, silicon dioxide film 6 should contain boron or other P-type impurity to lower the threshold voltage and should contain phosphorus or other N-type impurity to raise the threshold voltage of the device.

The structure of FIG. 1(b), including doped silicon dioxide film 6, is then subjected to a short annealing process. The change in voltage threshold of the device will be determined by the percent impurity concentration of P-type or N-type material in silicon dioxide layer 6, by the temperature of the annealing step, and by the length of the annealing step. Percentage concentrations of impurities may typically range from 1.5 percent to 10 percent. Annealing temperatures are typically in the 800 to 1000 degrees Celsius range. Annealing times may typically vary from 5 minutes to 30 minutes. For example, to lower the threshold voltage of a device with channel of P-type material by 0.5 volts, a silicon dioxide film with 4 percent phosphorus impurity may be deposited and annealed for 10 minutes at a temperature of 1000 degrees Celsius.

Figure 1C:
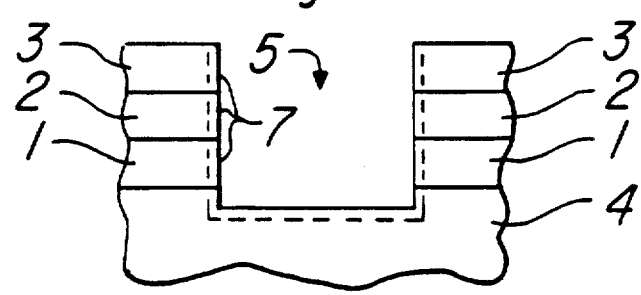
Figure 1D:
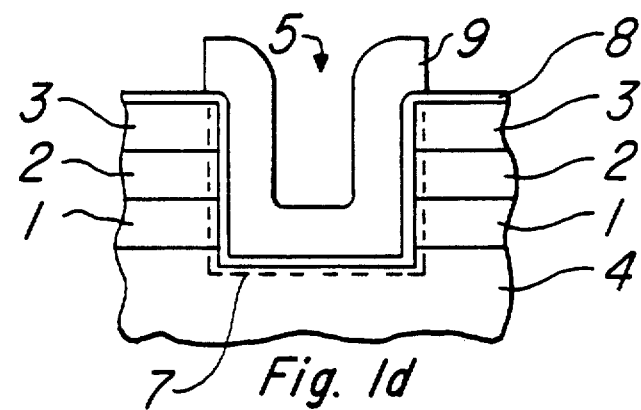

After completion of the annealing cycle, silicon dioxide layer 6 is removed by using a standard wet-etch cycle, leaving the structure with the threshold-voltage-adjustment region or margin 7 illustrated in FIG. 1(c). Oxide layer 8 and polysilicon or metal gate electrode 9 are formed or deposited and electrical connections are made to complete the transistor generally illustrated in FIG. 1(d).

The foregoing process alters the effective doping concentrations near the vertical trench surface of source-drain regions 1 and 3 in addition to altering the effective doping concentration at the vertical trench surface of channel region 2. A method for limiting alteration of the effective doping concentration to the region adjacent the vertical trench surface of channel region 2 is described below.

Figure 2A:
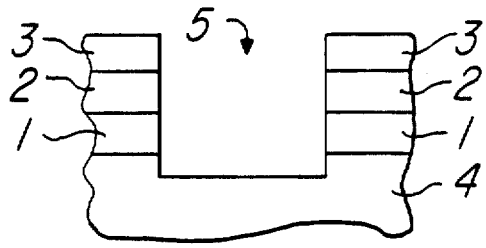
FIG. 2a–d are illustrated elevation views in section of a vertical MOS transistor at various stages of manufacture using a process of this invention to alter the effective doping concentration only near the trench surface of the channel of a vertical transistor.

Referring to FIG. 2(a), a vertical MOS transistor is again shown after formation of lower source-drain layer 1, channel layer 2, and upper source-drain layer 3 on substrate 4 and after formation of trench 5 extending at least through upper layer 3 and channel layer 2 into lower layer 1.

Figure 2B:
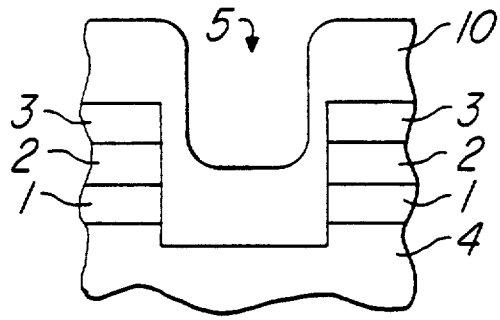

Referring to FIG. 2(b), a first silicon dioxide film 10 with no doping impurity concentration is deposited on the trench 5 surfaces and other surfaces of the structure using a chemical vapor deposition method that leaves a thicker deposit on the lower surface of the trench 5 than on the vertical walls of the trench 5. Such vapor depositions method are commonly accomplished using equipment that was used in early manufacture of integrated circuits. The thickness of the first film 10 deposited on the lower surface of the trench 5 should be such that the upper film surface exceeds the elevation of the upper boundary of lower source-drain 1 by the thickness of the film 10 deposited on the walls of trench 5.

Figure 2C:
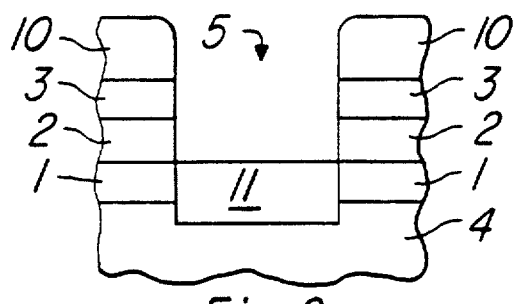

The non-doped first silicon dioxide film 10 is then partially removed by etching to expose the vertical trench 5 surface of the channel region and to leave a first layer 11 of non-doped silicon oxide at the bottom of trench 5 such that the sides of layer 11 cover the vertical trench 5 surface of lower source-drain 1, as illustrated in FIG. 2(c).

Figure 2D:
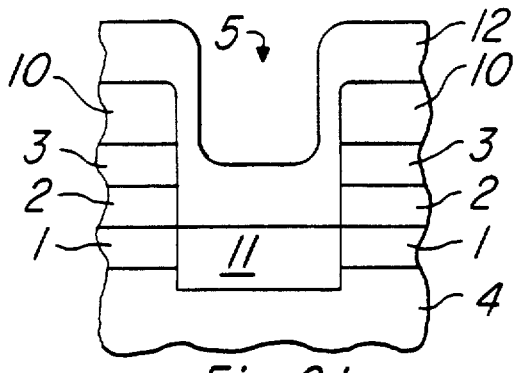

Referring to FIG. 2(d), a second silicon dioxide film 12 with prescribed impurity percentage of phosphorus or boron, for example, is deposited on the trench surfaces and over the surface of the structure using the chemical vapor deposition procedure described above, leaving a thicker deposit on the upper surface of first non-doped layer 11 than on the remaining vertical sides of the trench 5. The thickness of the second film 12 deposited over the upper surface of first layer 11 should be such that the upper film surface exceeds the elevation of the upper boundary of channel region 2 by an amount equal to the thickness of the film 12 deposited on the vertical surfaces of trench 5.

Figure 2E:
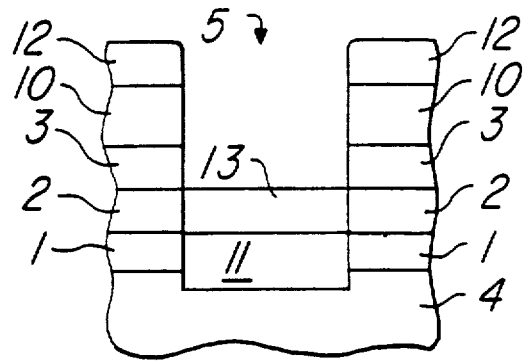

The structure is then etched to partially remove doped second film 12, leaving doped second layer 13 in trench 5 with the sides of doped second layer 13 covering channel region 2 as illustrated in FIG. 2(e).

Figure 2F:
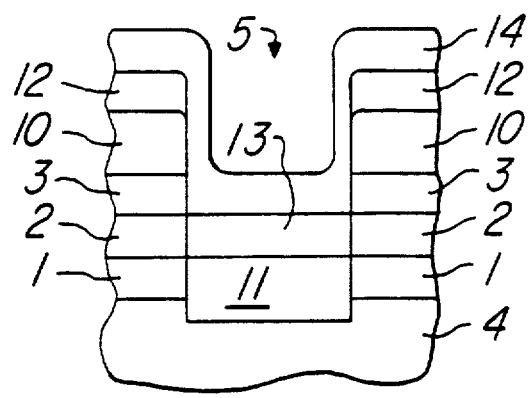

Referring to FIG. 2(f), a third silicon dioxide film 14 with no doping impurity concentration is deposited on the trench 5 surfaces and other surfaces of the structure using any convenient chemical vapor deposition method.

The next step in the process is to anneal the structure for a short time to allow the P-type or N-type impurity in second layer 13 to diffuse into channel region 2 altering the threshold voltage as described above.

Figure 2G:
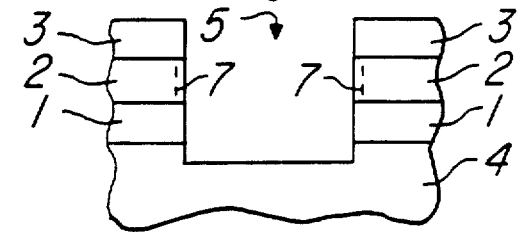
Figure 2H:
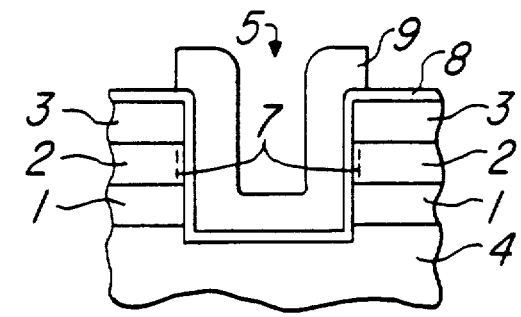

After completion of the annealing step, first and second layers 11 and 13 and third film 14 are removed by use of standard wet-etch cycle, leaving the structure with threshold-voltage-adjustment region 7 illustrated in FIG. 2(g). Gate oxide layer 8 and polysilicon or metal gate electrode 9 are formed or deposited and electrical connections are made to complete the transistor structure generally illustrated in cross-section in FIG. 2(h). While the invention has been described with reference to illustrative embodiments, the description is not to be construed in a limiting sense. Various modifications of the illustrative embodiments of the invention will be apparent to those of skill in the art and it is contemplated that the appended claims will cover any such modifications that fall within the scope of the invention.

I claim:

1. A metal-oxide-semiconductor transistor comprising:
   A. a substrate, said substrate presenting at least a base region;
   B. a doped lower source-drain layer of a first conductivity type formed on said base region, and presenting at least a first substantially vertical sidewall extending upwardly from said base region;
   C. a channel layer, more heavily doped than said lower source-drain layer, of a second conductivity type formed on said lower source-drain layer and presenting at least a second substantially vertical sidewall, said second sidewall extending upwardly from said first sidewall and at least said channel layer including a counterdoped threshold-voltage-adjustment region in at least a margin of said second sidewall;
   D. an upper source-drain layer of said first conductivity type, less heavily doped than said channel layer, formed on said channel layer and presenting at least a third substantially vertical sidewall, said third sidewall extending upwardly from said second sidewall;

E. an insulating oxide layer on at least said base region, first, second and third sidewalls; and F. a gate electrode on said insulating oxide layer opposite at least said channel layer.

2. The vertical transistor of claim 1 in which said first conductivity type is P-type and said second conductivity type in N-type.

3. The vertical transistor of claim 1 in which said first conductivity type is N-type and said second conductivity type is P-type.

4. The vertical transistor of claim 1 in which said threshold-voltage-adjustment region is comprised of P-type material with effective doping level altered by N-type impurity diffusion.

5. The vertical transistor of claim 1 in which said threshold-voltage-adjustment region is comprised of N-type material with effective doping level altered by P-type impurity diffusion.

6. The transistor of claim 1 in which said gate electrode is on said insulating oxide layer opposite at least said first, second and third sidewalls.

7. The transistor of claim 1 in which said gate electrode is on said insulating oxide layer opposite at least said base region, first, second and third sidewalls.

8. A metal-oxide-semiconductor transistor comprising:

A. a semiconductor substrate, said substrate presenting at least a base region;

B. a lower source-drain layer of doped semiconductor material of a first conductivity type formed on said base region, and presenting a continuous first substantially vertical sidewall extending upwardly from said base region, said continuous first sidewall having portions defining a trench, and said first sidewall further having a margin;

C. a channel layer of semiconductor material, more heavily doped than said lower source-drain layer, of a second conductivity type formed on said lower source-drain layer and presenting a continuous second substantially vertical sidewall in alignment with said first sidewall, said continuous second sidewall having portions defining a trench, and said second sidewall further having a margin;

D. an upper source-drain layer of semiconductor material, less heavily doped than said channel layer, of said first conductivity type formed on said channel layer and presenting at least a third substantially vertical sidewall in alignment with said second and first sidewalls, said continuous third sidewall having portions defining a trench, and said third sidewall further having a margin;

E. an insulating oxide layer of semiconductor material on at least said base region, first, second and third sidewalls;

F. a counterdoped threshold-voltage-adjustment region in all margins;

G. a conductive gate electrode formed on said insulating oxide layer opposite at least said base region, first, second and third sidewalls.

* * * * *